United States Patent
Sancheti et al.

[11] Patent Number: 6,101,134
[45] Date of Patent: Aug. 8, 2000

[54] METHOD AND CIRCUITRY FOR WRITING DATA

[75] Inventors: Sanjay K. Sancheti; George M. Ansel; William G. Baker; James E. Kelly, all of Starkville, Miss.

[73] Assignee: Cypress Semiconductor Corp., San Jose, Calif.

[21] Appl. No.: 09/344,514

[22] Filed: Jun. 25, 1999

[51] Int. Cl.[7] .................................................. G11C 11/407
[52] U.S. Cl. .................. 365/189.05; 365/194; 365/233.5; 365/233; 365/191
[58] Field of Search ........................ 365/189.01, 189.05, 365/194, 233, 233.5, 191

[56] References Cited

U.S. PATENT DOCUMENTS

| | | | |
|---|---|---|---|
| 5,305,268 | 4/1994 | McClure | 365/203 |
| 5,384,745 | 1/1995 | Konishi et al. | 365/230.03 |
| 5,404,327 | 4/1995 | Houston | 365/203 |
| 5,631,871 | 5/1997 | Park et al. | 365/203 |
| 5,717,654 | 2/1998 | Manning | 365/233.5 |
| 5,721,859 | 2/1998 | Manning | 397/421.07 |
| 5,751,644 | 5/1998 | Ansel et al. | 365/194 |
| 5,764,591 | 6/1998 | Matsui | 365/233.5 |

*Primary Examiner*—Viet Q. Nguyen
*Attorney, Agent, or Firm*—Christopher P. Maiorana, P.C.

[57] ABSTRACT

An apparatus comprising a first circuit, a reset circuit and an output circuit. The first circuit may be configured to generate one or more state signals in response to (i) a first and a second write control signals and (ii) one or more control signals. The reset circuit may be configured to generate the one or more control signals in response to (i) a global write signal and (ii) the first and second state signals. The output circuit may be configured to generate a third and fourth write control signal in response to (i) the global write signal (ii) a data input signal and (iii) the first and second state signals. In one example, the third and fourth write control signals may generate a pulse on either the third or the fourth write control signals in response to a transition of the data input signal.

16 Claims, 3 Drawing Sheets

METHOD AND CIRCUITRY FOR WRITING DATA

FIELD OF THE INVENTION

The present invention relates to write control circuits generally and, more particularly, to a circuit and method for writing data that may be insensitive to input glitches.

BACKGROUND OF THE INVENTION

Conventional data transition detect (DTD) circuits can terminate a bit line write signal after a constant delay. Such circuits can operate on a single transition of a data input and can allow write recovery to start without waiting until the end of an active write cycle. Provided that the user meets tSD (e.g., data setup to end-of-write), the correct data is written. A change in data input must start a new write pulse, regardless of when that change occurs.

Address transition detect (ATD) circuits can operate on external data pins to generate a global write pulse signal.

Another approach may be found in U.S. Pat. No. 5,751,644, entitled Data Transition Detect Write Control, is illustrated in FIG. 1 and is hereby incorporated by reference in its entirety. The latch R/S1 keeps the write driver (e.g., ND3 and ND4) enabled for writing either a data 0 or a data 1. When the signal WR_1 is equal to 1 and the signal WR_0 is equal to 0, the circuit is enabled for writing a 1. When the signal WR_1 is equal to 0 and the signal WR_0 is equal to 1, the circuit is enabled for writing a 0. For example, when writing 1, the write driver is initially enabled for writing a 1. The data makes a 0 to 1 transition and the signal WDATAB switches from 1 to 0. The data 1 is written into the memory array. The delayed 1 to 0 transition (e.g., the wdata delay) switches the latch R/S1 to be enabled for writing a 0 to end the write.

The main disadvantage of the circuit of FIG. 1 is that it may be vulnerable to data input DIN glitches that may lead to write failure in the memory cell. If the data first makes a transition from 0 to 1, and then from 1 to 0, the pulse width at data input DIN may be such that data is written into the memory cell, but cannot change the state of the latch R/S1 due to the filtering of the signal WDATA in the delay element. During such a condition, the write driver cannot write the new data 0, since it is still enabled for writing a 1. The same reasoning holds for the opposite data polarity.

The potential glitch condition may arise because the gates ND3 and ND4 are controlled by the two outputs of the same latch R/S1. There is no mechanism to keep the write driver enabled for either data polarity in the event of glitches or short pulses on data input signal DIN.

SUMMARY OF THE INVENTION

The present invention concerns an apparatus comprising a first circuit, a reset circuit and an output circuit. The first circuit may be configured to generate one or more state signals in response to (i) a first and a second write control signals and (ii) one or more control signals. The reset circuit may be configured to generate the one or more control signals in response to (i) a global write signal and (ii) the first and second state signals. The output circuit may be configured to generate a third and fourth write control signal in response to (i) the global write signal (ii) a data input signal and (iii) the first and second state signals.

The objects, features and advantages of the present invention include providing a circuit and method for writing data to a memory that may (i) be insensitive to data input glitches, (ii) provide independent latches for write driver control and/or (iii) operate in either polarity.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
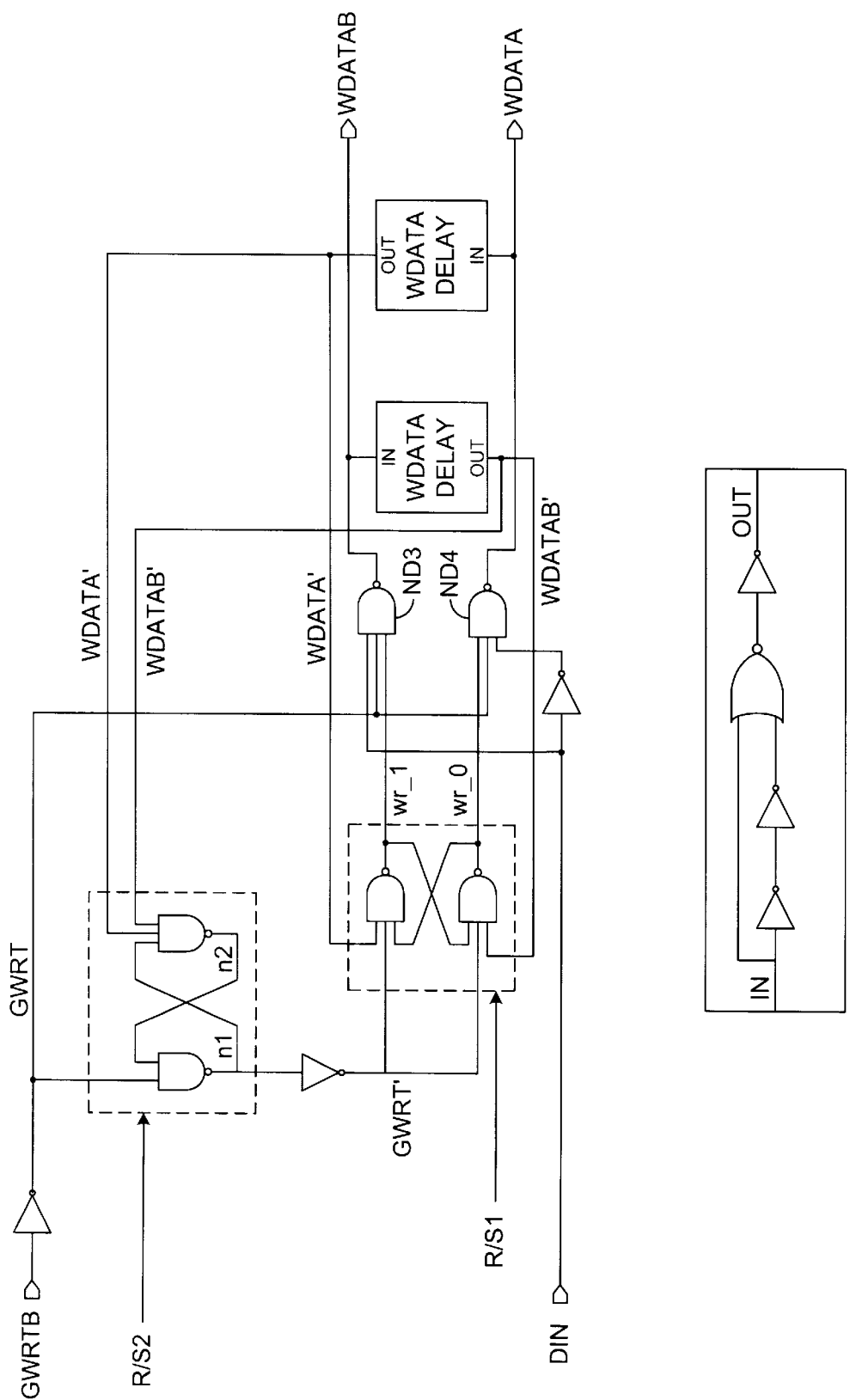
FIG. 1 is a diagram of a conventional data transition detect write circuit.
Figure 2:
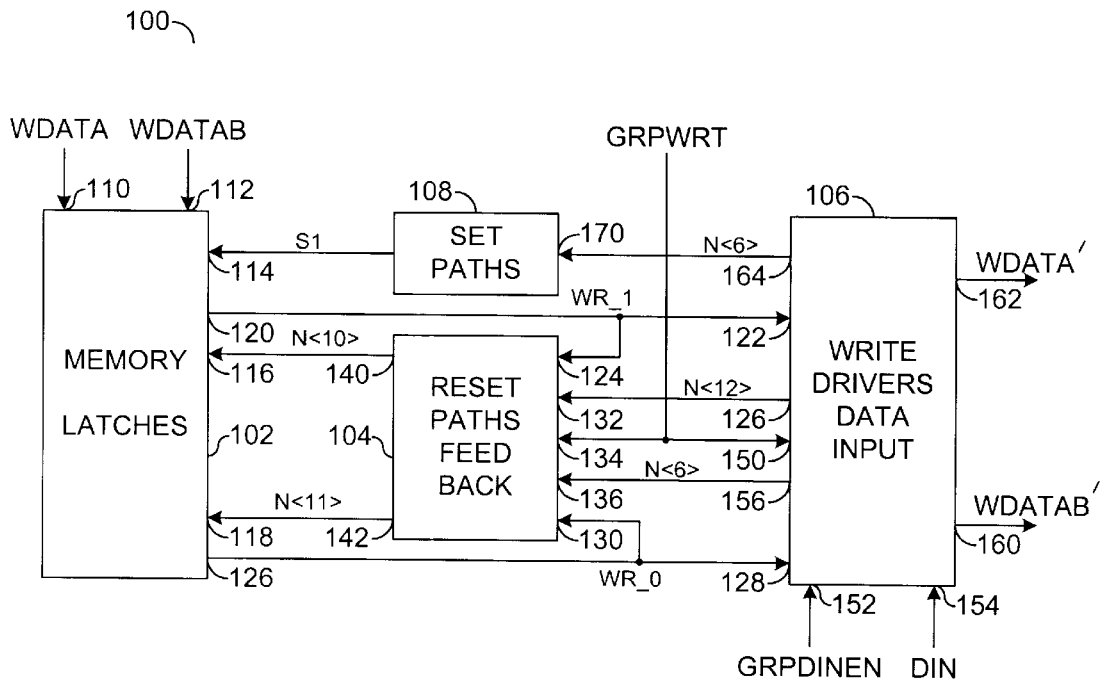
FIG. 2 is a block diagram of a preferred embodiment of the present invention.

Referring to FIG. 2, a block diagram of a circuit 100 is shown in accordance with a preferred embodiment of the present invention. The circuit 100 generally comprises a memory latch block (or circuit) 102, a reset path/feedback block (or circuit) 104 and a write drivers/data input block (or circuit) 106. Additionally, the circuit 100 may comprise a set path block (or circuit) 108.

The memory latch circuit 102 may have an input 110 that may receive a signal (e.g., WDATA), an input 112 that may receive a signal (e.g., WDATAB), an input 114 that may receive a signal (e.g., S1) from the set path block 108, an input 116 that may receive a signal (e.g., n<10>) from the reset circuit 104 and an input 118 that may receive a signal (e.g., n<11>) from the reset circuit 104. The memory latch circuit 102 may present a signal (e.g., WR_1) to an input 122 of the write drivers block 106 as well as to an input 124 of the reset path 104. The memory latch circuit 102 may also have an output 126 that may present a signal (e.g., WR_0) to an input 128 of the write driver circuit 106 as well as to an input 130 of the reset circuit 104. The signals WDATA and WDATAB may be write control signals. The signals WR_0 and WR_1 may be state signals.

The reset circuit 104 may have an input 132 that may receive a signal (e.g., n<12>) from an output 126 of the write driver circuit 106, an input 134 that may receive a signal (e.g., GRPWRT) and an input 136 that may receive a signal (e.g., n<6>) from an output 156 of the write driver circuit 106. The signal GRPWRT may be a group write (or global write) signal. The reset circuit 104 may have an output 140 that may present the signal n<10> to the input 116 of the memory latch circuit 102 and an output 142 that may present the signal n<11> to the input 118 of the memory latch circuit 102. The reset circuit 104 may present the signals at the outputs 140 and 142 in response to the signals WR_1, n<12>, GRPWRT, n<6> and WR_0 received at the inputs 124, 132, 134, 136 and 130.

The write driver circuit 106 may have an input 150 that may receive the signal GRPWRT, an input 152 that may receive a signal (e.g., GRPDINEN) and an input 154 that may receive a signal (e.g., DIN). The signal DIN may be a data input signal. The signal GRPDINEN may be an enable signal. The write drivers circuit 106 may also have an output 160 that may present a signal WDATAB', an output 162 that may present a signal WDATA' and an output 156 that may present the signal n<6> to an input 170 of the set path circuit 108. The signals WDATA' and WDATAB' may be write control signals that may be used to control writing data to a memory (not shown). In one example, the signals WDATA and WDATAB may be feedbacks of the signals WDATA' and WDATAB'. In another example, the signals WDATA and WDATAB may be generated by an external write control device (not shown). In another example, the signals WDATA and WDATAB may be generated in response to the signals WDATA' and WDATAB', along with some intermediate circuitry (not shown).

Figure 3:
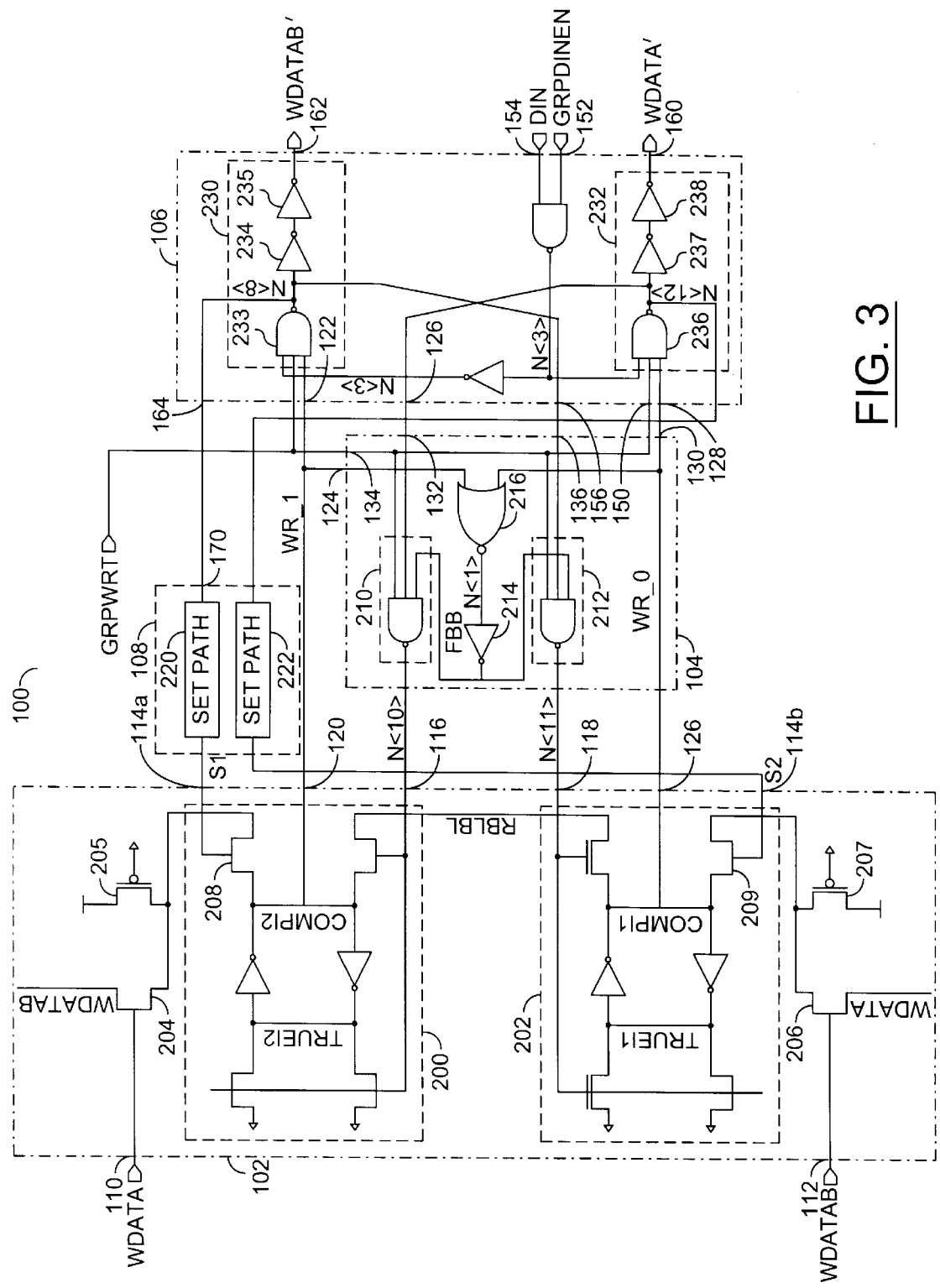
FIG. 3 is a circuit diagram of the circuit of FIG. 2.

Referring to FIG. 3, a more detailed diagram of the circuit 100 is shown. The memory latch circuit 102 may comprise a latch 200 and a latch 202. The latch 200 and the latch 202 may be implemented, in one example, as a memory cell. The memory latch circuit 102 may comprise a transistor 204, a transistor 205, a transistor 206 and a transistor 207. The transistor 204 may receive the signal WDATA and the transistor 206 may receive the signal WDATAB. The transistor 204 may be in series with a pass gate 208 of the latch 200. Similarly, the transistor 206 may be in series with a pass gate 209 of the latch 202.

The reset circuit 104 may comprise a reset path 210 and a reset path 212. The reset path 210 and the reset path 212 may be implemented, in one example, as NAND gates. However, other appropriate gates may be implemented accordingly to meet the design criteria of a particular implementation. The reset circuit 104 may also comprise an inverter 214 and a NOR gate 216. The output of the inverter 214 is generally presented to one of the inputs of each of the reset paths 210 and 212. The output of the inverter 214 generally presents a logical NOR of the signal WR_1 and the signal WR_0. In one example, the inverter 214 and the NOR gate 216 may be implemented as a logical equivalent circuit, such as a single logical OR gate. The reset path 210 and the reset path 212 may be implemented, in one example, as high trip point devices.

The set path 108 may comprise a set path 220 and a set path 222. The set path 220 and the set path 222 may provide a delay path that may be implemented, in one example, as one or more edge-preferential resettable delays. However, other delays may be implemented accordingly to meet the design criteria of a particular implementation.

The write driver circuit 106 may comprise a write driver 230 and a write driver 232. The write driver 230 may comprise a gate 233, an inverter 234 and an inverter 235. Similarly, the write driver 232 may comprise a gate 236, an inverter 237 and an inverter 238. A pulse may be generated on the signals WDATA' and WDATAB', during which writing to memory cell is completed. The pulse width may be constant for a single transition in the data input signal DIN. The pulse may be adjusted by the loop delay.

The constant delay loop, which generally terminates a bitline write for the signal WDATAB' may be formed by the latch 200, the set path 220 and the write driver 230. The constant delay loop that may terminate a bitline write for the signal WDATA' may be formed by the latch 202, the set path 222 and the write driver 232. Independent latches 200 and 202 may be used to control the separate write drivers 230 and 232. A faster reset (e.g., writing 0) of the latch 200 or 202 may occur with any change in the data input signal DIN so that write drivers 230 or 232 may be enabled for either data polarity (e.g., a ready state). If the data input signal DIN glitches, or has a shorter pulse width so that the signals WDATA' and WDATAB' have a pulse that is chopped, the write driver 106 is held in the ready state until the data input signal DIN settles to a stable state after which stable data may be written into the memory array. A delayed set (e.g., writing 1) of latches 200 or 202 may occur after data is written into the memory to end write pulse (e.g., WDATA' or WDATAB') on bitline to pull the bitline to 1.

Figure 4:
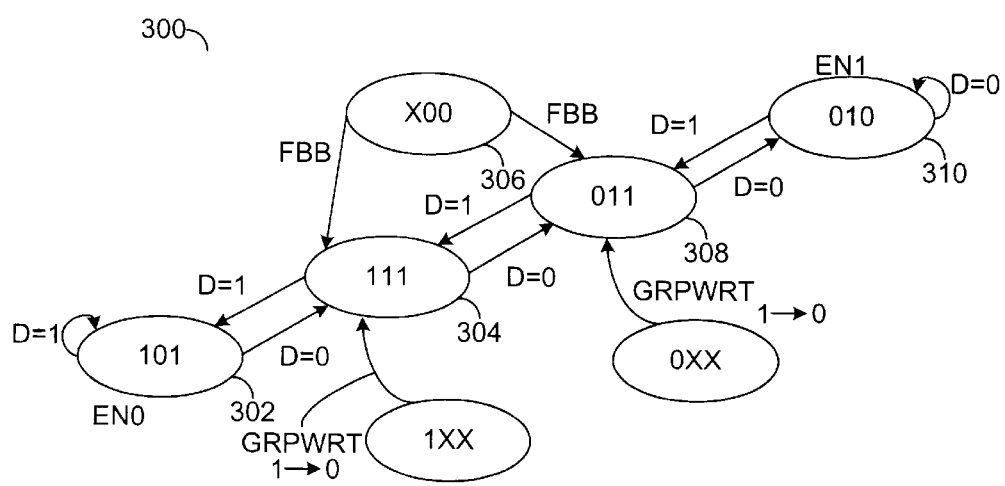
FIG. 4 is a state diagram illustrating the operation of the circuit of FIG. 2.

Referring to FIG. 4, a state diagram 300 of the present invention is shown. The three state variables shown in the state diagram (e.g., x x x) that generally represent (i) the state of the memory cell controlled by the circuit 100, (ii) the signal WR_1 and (iii) the signal WR_0). The state diagram 300 generally comprises a state 302, a state 304, a state 306, a state 308 and a state 310. The following TABLE 1 illustrates the state of the circuit 100 in response to the signals WR_1 and WR_0:

TABLE 1

| WR_1 | WR_0 | Status |
| --- | --- | --- |
| 1 | 0 | EN1 |
| 0 | 1 | EN0 |
| 1 | 1 | Ready state |
| 0 | 0 | Feedback moves to ready state |

The state 302 illustrates the circuit in the state EN0 (e.g., 1 0 1). If the data continues to equal 1, the circuit 100 generally remains in the state 302. If the data transitions to a 0, the circuit 100 generally transitions to the state 304, which is generally a ready state (e.g., x 1 1). If the data transition is back to 1, the circuit 100 enters the state 302. If the data remains 0, the circuit 100 enters the state 308 (e.g., 0 1 1) which may still be the ready state. If the data transition is back to a 1, the circuit 100 enters the state 304 (e.g., 1 1 1). If the data remains a 0, the circuit enters the state 310, which is generally the state EN1 (e.g., 0 1 0). If the data remains a 0, the circuit 100 remains in the state 310. Additionally, the state 306 shows a feedback state (e.g., FBB) of the memory cell latches (e.g., 0 1 1). If both of the signals WR_1 and WR_0 are 0 (e.g., x 0 0), then the signal FBB may take them to one of the ready states (e.g., 1 1 1) or (e.g., 0 1 1). If the global write signal GRPWRT transitions from a 1 to a 0, the circuit 100 generally enters either the state 304 or the state 308.

The following example illustrates the operation of the circuit 100 when the write driver is in the state EN1 and the data is 0 (e.g., 0 1 0). When the data input signal DIN makes 0 to 1 transition, the signal WR_0 generally switches from 0 to 1 before data is written to the memory array. The signal WR_1 is generally equal to the signal WR_0 (e.g., 1) and the circuit 100 is in the ready state (e.g., 0 1 1). If the data input signal DIN has a shorter pulse width (e.g., from 0 to 1, then 1 to 0), the write driver 106 is generally able to write the 0, since the circuit 100 is in ready state (e.g., x 1 1). The circuit 100 will generally be held in the ready state until the data input signal DIN settles to a stable value after which stable data may be written into the memory. The circuit may switch to the state EN1 or the state EN0 to end the write pulse on bitlines depending on the final data polarity.

The circuit 100 may comprise two independent latches 200 and 202 (e.g., memory cells) to independently terminate writing a 1 and writing a 0. If the data input signal DIN changes, both latches are reset, (re)enabling a write of either data polarity (e.g., the ready state). This makes the write driver 106 generally insensitive to data input glitches. The latches 200 and 202 may be implemented as memory cells that operate slower to set and faster to reset than the memory cells that implement the memory that may be controlled.

The present invention may be used to control writing information to a memory, such as a Static Random Access Memory (SRAM). However, the present invention may be used to control other types of memories, such as Dynamic Random Access Memory (DRAM), SDRAM, a Dual Port RAM, etc.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first circuit configured to generate one or more state signals in response to (i) a first and a second write control signals and (ii) one or more control signals;
    a reset circuit configured to generate said one or more control signals in response to (i) a global write signal and (ii) said first and second state signals; and
    an output circuit configured to generate a third write control signal and a fourth write control signal in response to (i) said global write signal (ii) a data input signal and (iii) said first and second state signals.

2. The circuit according to claim 1, wherein said first and second write control signals are a feedback of said third and fourth write control signals.

3. The circuit according to claim 1, wherein said first and second write control signals are generated in response to said third and fourth write control signals.

4. The circuit according to claim 1, wherein said first and second write control signals are generated in response to an external write control circuit.

5. The circuit according to claim 1, wherein said first circuit generates said one or more state signals in further response to a set signal.

6. The circuit according to claim 5, further comprising a set circuit configured to generate said one or more set signals in response to an output of said output circuit.

7. The circuit according to claim 1, wherein said output circuit generates said third and fourth write control signals in further response to one or more enable signals.

8. The circuit according to claim 1, wherein said reset circuit generates said one or more control signals, in further response to one or more second output signals received from said output circuit.

9. The circuit according to claim 1, wherein said reset circuit generates said one or more control signals in further response to a third output of said output circuit.

10. The circuit according to claim 1, wherein said output circuit comprises a write driver and data input circuit.

11. The circuit according to claim 6, wherein said set circuit comprises a delay.

12. The circuit according to claim 6, wherein said set circuit comprises an edge preferential delay.

13. The circuit according to claim 1, wherein said third and fourth write control signals are insensitive to glitches on said data input signal.

14. A circuit comprising:
    means for generating one or more state signals in response to (i) a first and a second write control signals and (ii) one or more control signals;
    means for generating said one or more control signals in response to (i) a global write signal and (ii) said first and second state signals; and
    means for generating a third write control signal and a fourth write control signal in response to (i) said global write signal (ii) a data input signal and (iii) said first and second state signals.

15. A method of generating write control signals insensitive to glitches on a data input signal comprising the steps of:
    (A) enabling a write of a first or second value in response to a data input change;
    (B) holding in a ready state until the data input is stable; and
    (C) writing stable data into a memory array.

16. The method according to claim 15, further comprising the step of:
    (D) enabling a write for the opposite data value.

* * * * *